United States Patent
Tosaya

(10) Patent No.: US 6,508,845 B1
(45) Date of Patent: Jan. 21, 2003

(54) METHOD AND APPARATUS FOR PRECOINING BGA TYPE PACKAGES PRIOR TO ELECTRICAL CHARACTERIZATION

(75) Inventor: Eric S. Tosaya, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/151,941

(22) Filed: May 22, 2002

Related U.S. Application Data

(62) Division of application No. 09/892,798, filed on Jun. 28, 2001, now Pat. No. 6,399,474.
(60) Provisional application No. 60/214,451, filed on Jun. 28, 2000.

(51) Int. Cl.$^7$ .................. H01L 21/00; H01L 21/64; H01L 23/48; H01L 23/52; H01L 23/28
(52) U.S. Cl. .............. 29/25.01; 257/780; 257/781; 438/613; 451/28; 451/49
(58) Field of Search ............... 438/612, 613, 438/614, 616, 617, 108, 615; 257/778, 779, 780, 781; 29/25.01, 827, 832; 451/28, 49

(56) References Cited

U.S. PATENT DOCUMENTS

| | | | |
|---|---|---|---|
| 5,435,482 A | 7/1995 | Variot et al. | ............... 228/254 |
| 5,989,937 A * | 11/1999 | Variot et al. | ............... 438/108 |
| 6,084,781 A | 7/2000 | Klein | ............... 361/771 |
| 6,267,650 B1 * | 7/2001 | Hembree | ............... 451/388 |
| 6,416,386 B2 * | 7/2002 | Hembree | ............... 451/28 |
| 6,416,387 B2 * | 7/2002 | Hembree | ............... 451/28 |
| 6,416,388 B2 * | 7/2002 | Hembree | ............... 451/28 |
| 6,416,395 B1 * | 7/2002 | Hembree | ............... 451/49 |
| 6,416,397 B2 * | 7/2002 | Hembree | ............... 451/49 |
| 6,416,398 B2 * | 7/2002 | Hembree | ............... 451/49 |
| 6,416,399 B2 * | 7/2002 | Hembree | ............... 451/49 |
| 6,419,550 B2 * | 7/2002 | Hembree | ............... 451/6 |
| 6,422,919 B2 * | 7/2002 | Hembree | ............... 451/28 |
| 6,422,923 B2 * | 7/2002 | Hembree | ............... 451/41 |
| 6,431,952 B2 * | 7/2002 | Hembree | ............... 451/5 |

\* cited by examiner

*Primary Examiner*—Olik Chaudhuri
*Assistant Examiner*—Timothy J. Sutton

(57) ABSTRACT

A method and apparatus for precoining a ball grid array (BGA) type package prior to electrical characterization of the package employs a heated pressing plate with a smooth, flat bottom. The heated pressing plate is controllably pressed against a plurality of solder balls attached to a chip scale package. The heated pressing planarizes the tops of the solder balls, thereby evening out height differences among the solder balls. With the height differences evened out, a grounding plate of a test fixture can be applied on the array of solder balls and reliably contact each of the solder balls that are to be grounded, regardless of their initial height differences.

3 Claims, 5 Drawing Sheets

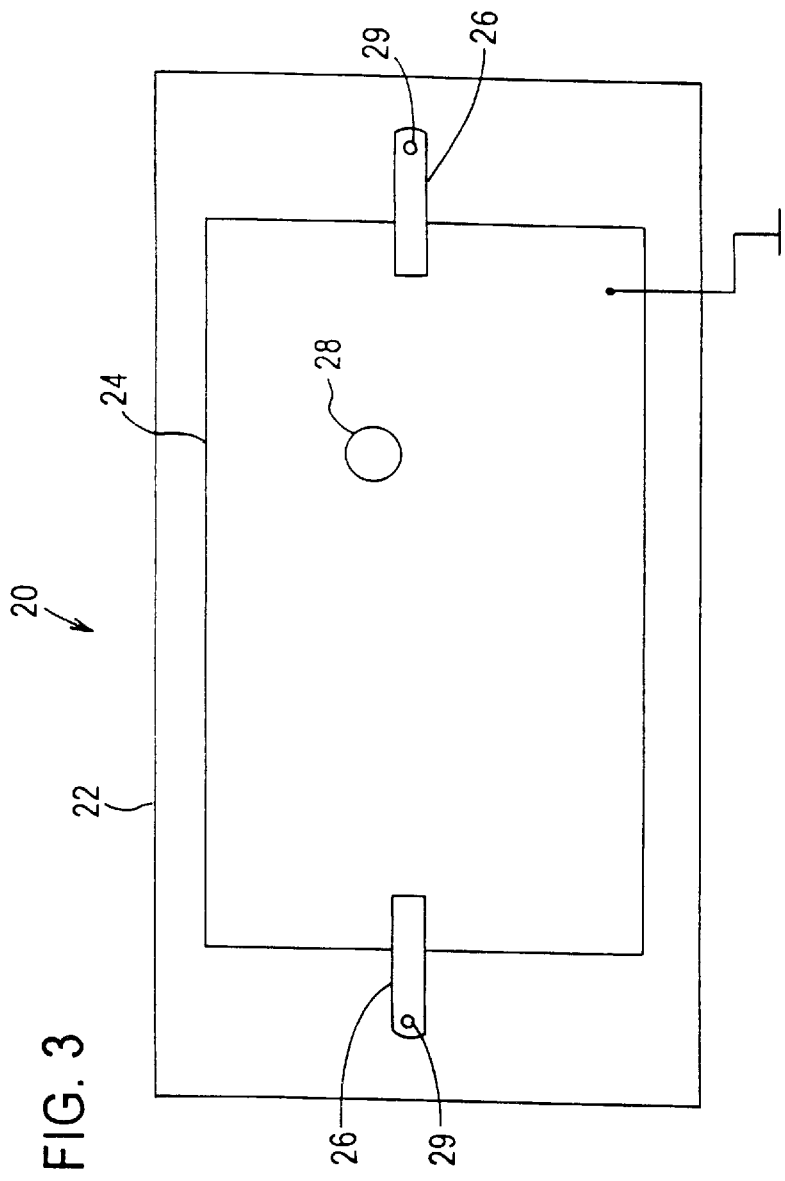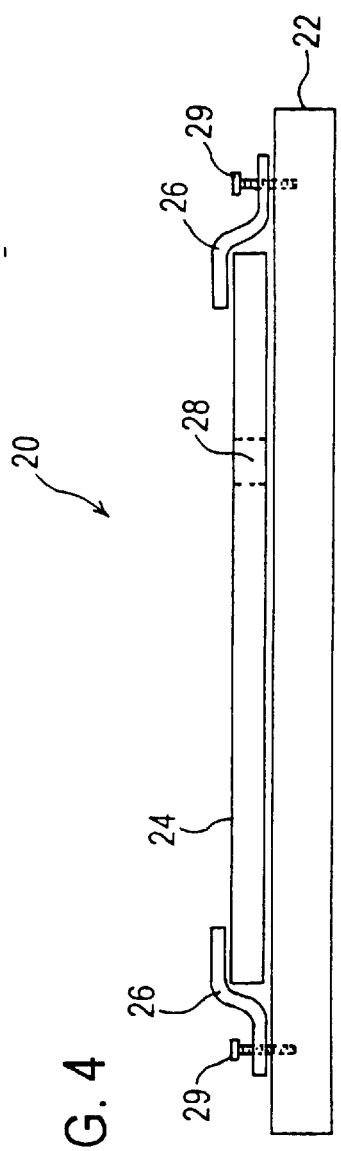
FIG. 3
FIG. 4

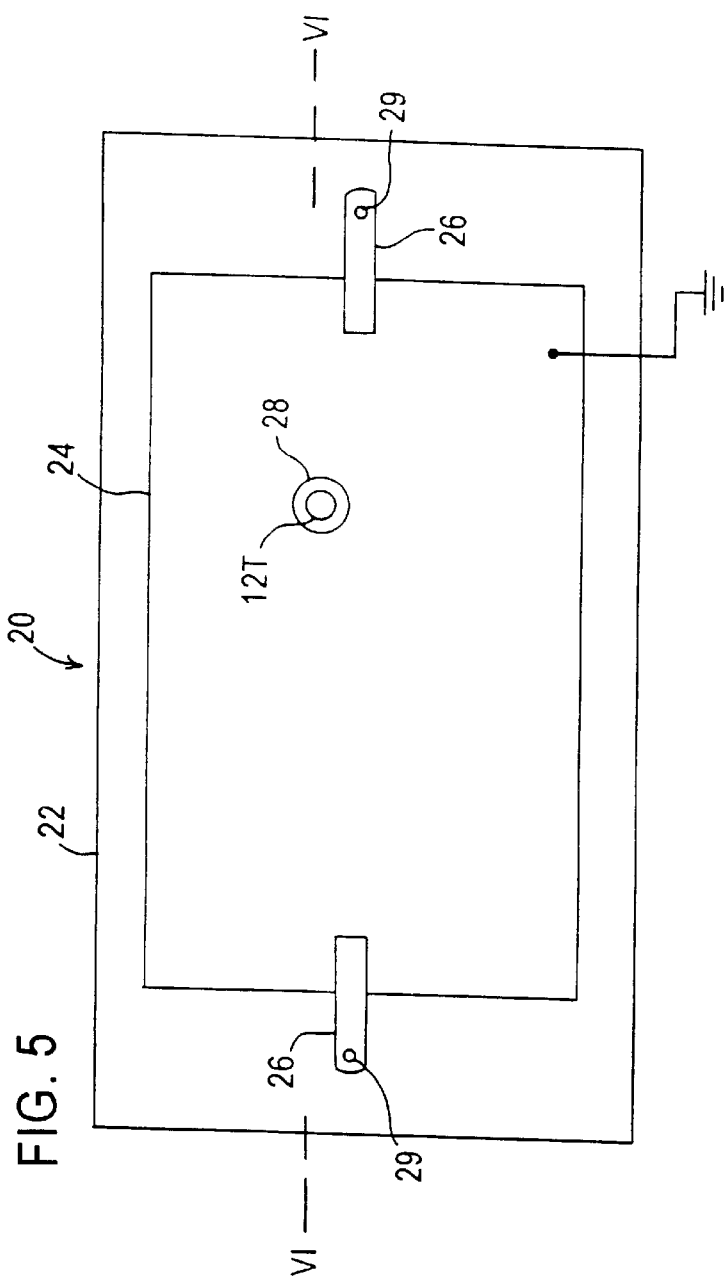
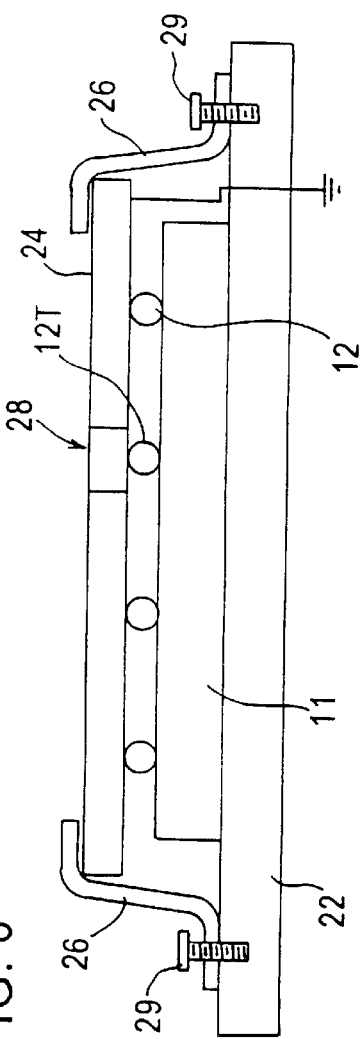
FIG. 5
FIG. 6

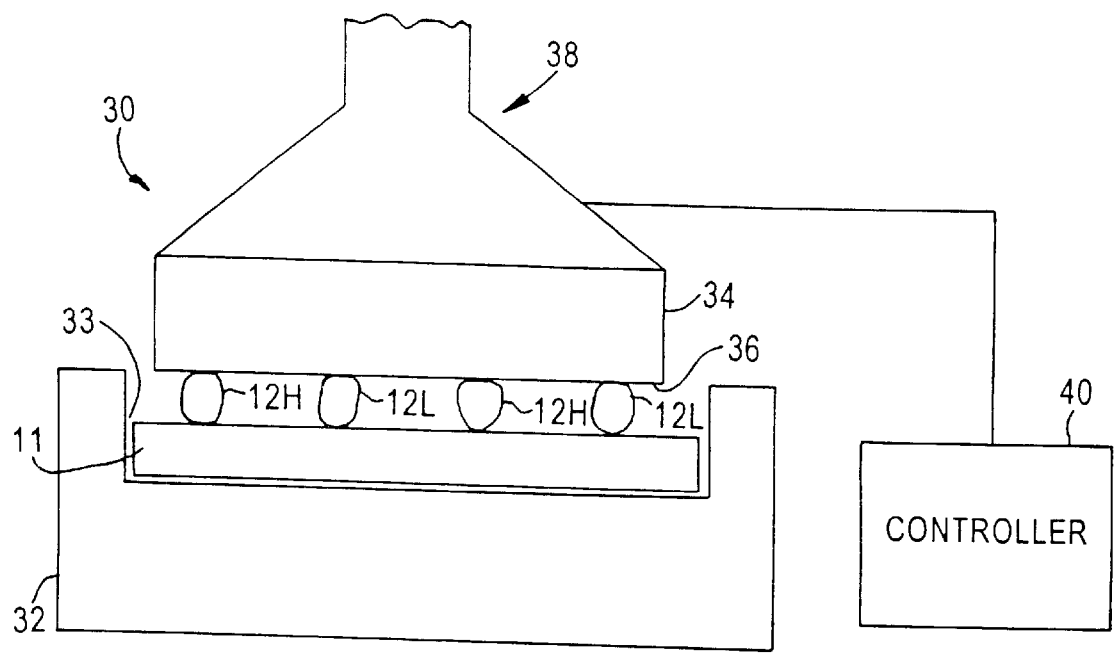
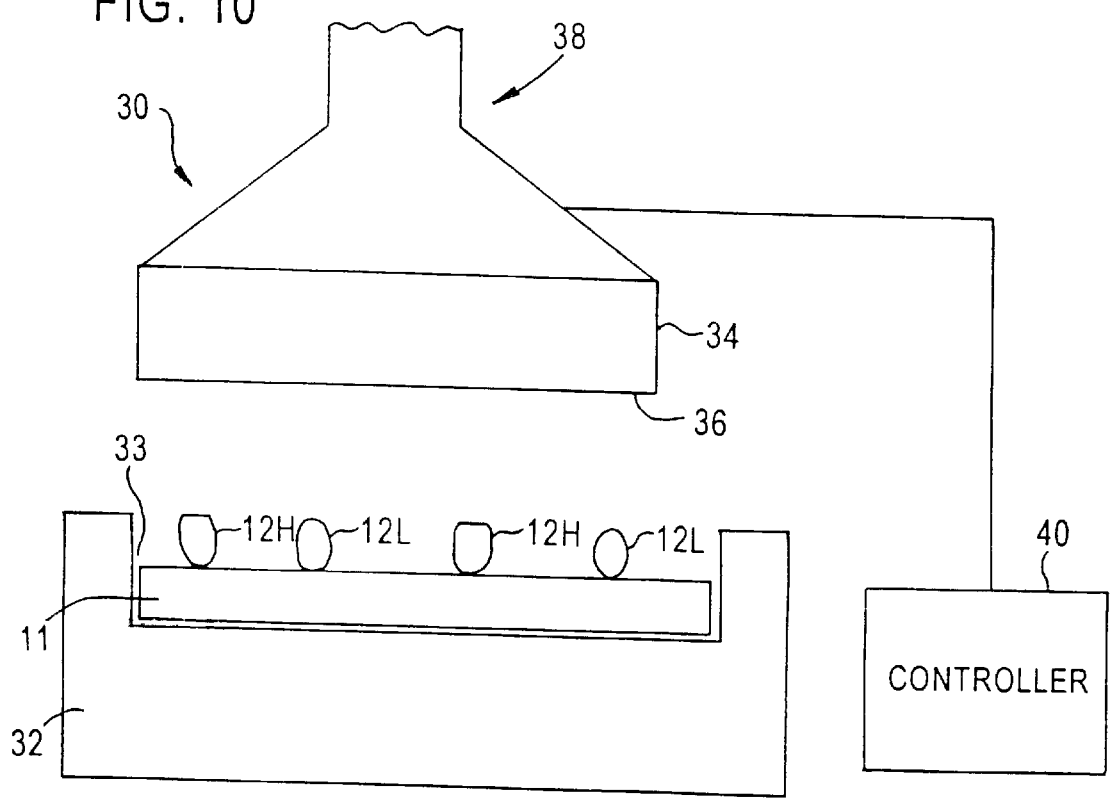

METHOD AND APPARATUS FOR PRECOINING BGA TYPE PACKAGES PRIOR TO ELECTRICAL CHARACTERIZATION

RELATED APPLICATIONS

This application is a divisional of U.S. patent application Ser. No. 09/892,798, filed Jun. 28, 2001, now U.S. Pat. No. 6,399,474, which claims priority from U.S. Provisional Patent Application No. 60/214,451, filed Jun. 28, 2000.

FIELD OF THE INVENTION

The present invention relates to the testing of integrated circuits, and in particular, to the preparation of a chip scale package prior to electrical characterization of the package.

DESCRIPTION OF RELATED ART

Electrical components utilizing integrated circuit chips are used in a number of applications. Controlled Collapsed Chip Connection is an interconnect technology developed as an alternative to wire bonding. This technology is generally known as C4 technology, or flip chip packaging. Broadly stated, one or more integrated circuit chips are mounted above a single or multiple layer substitute and pads on the chip are electrically connected to corresponding pads on a substrate by a plurality of electrical connections, such as solder bumps. The integrated circuit chips may be assembled in an array such as a 10×10 array. A substrate is then electrically connected to another electronic device such as a circuit board with the total package being used in an electronic device such as a computer.

It is desirable to perform an electrical characterization of an integrated circuit by measuring inductance (L), capacitance (C), and resistance (R) at electrical contacts of the integrated circuit. This has presented a problem, however, when measuring these parameters for a "chip scale package." Semiconductor dice, or chips, are typically individually packaged for use in plastic or ceramic packages. This is sometime referred to as the first level of packaging. The package is required to support, protect, and dissipate heat from the die and to provide a lead system for power and signal distribution to the die. The package is also useful for performing burn-in and functionality testing of the die.

One type of semiconductor package is referred to as a "chip scale package." Chip scale packages are also referred to as "chip size packages," and the dice are referred to as being "minimally packaged." Chip scale packages can be fabricated in "uncased" or "cased" configurations. Uncased chip scale packages have a footprint that is about the same as an unpackaged die. Cased chip scale packages have a peripheral outline that is slightly larger than an unpackaged die. For example, a footprint for a typical cased chip scale package can be about 1.2 times the size of the die contained within the package.

Typically, a chip scale package includes a substrate bonded to the face of the die. The substrate includes the external contacts for making outside electrical connections to the chip scale package. The substrate for a chip scale package can comprise flexible material, such as a polymer tape, or a rigid material, such as silicon, ceramic, or glass. The external contacts for one type of chip scale package includes solder balls arranged in a dense array, such as a ball grid array "BGA," or a fine ball grid array "FBGA." These dense arrays permit a high input/output capability for the chip scale package. For example, a FBGA on a chip scale package can include several hundred solder balls.

In order to test the electrical characteristics of the integrated circuit, test probes are used to contact individual solder balls. Performing precise measurements of the electrical characteristics on a chip scale package is very difficult, however, due to the dimensions. It is hard to isolate a single solder ball or other electrical contact. while grounding the remainder of the solder balls. Hence, isolation and testing of a single, selected solder ball of an integrated circuit has proven to be a difficult task.

One of the reasons for the problems in performing electrical characterization of a chip scale package is the difficulty of simultaneously grounding all of the solder balls that are to be grounded on the package. Even with modern sophisticated manufacturing techniques, the solder balls of a ball grid array on a chip scale package will typically have heights that are slightly different from one another. It is possible to simultaneously ground all of the solder balls of a ball grid array with a flat conductive plate placed against the solder balls, but only if the conductive plate contacts each one of the balls. This can occur if the solder balls are the same height, but is problematic when the balls are of different heights, as the conductive plate will contact only the highest solder balls.

SUMMARY OF THE INVENTION

There is a need for a method and apparatus for preparing a chip scale package to allow simultaneous contact of all of the solder balls of a ball grid array during electrical characterization of the package, even when the solder balls are manufactured with different heights on the package.

This and other needs are met by the present invention which provides a method of preparing and testing electrical characteristics of a chip scale package that has a plurality of solder balls with solder ball tops and solder ball bottoms attached to a surface of the package. The method comprises planarizing the tops of the plurality of solder balls such that the solder balls extend the same distance in a normal direction from the package surface. A conductive plate is placed on the chip scale package such that the conductive plate contacts the top of each of the plurality of solder balls, except for a selected subset of the solder balls. The conductive plate is grounded to thereby ground all of the solder balls except for the selected subset. The selected subset of solder balls, i.e., those not grounded, are exposed to allow testing of the electrical characteristics at the selected subset.

In certain embodiments of the invention the planarizing involves applying a heated pressing plate having a smooth, flat bottom surface against the tops of the solder balls. The heating and pressing is continued with a controlled pressure until a portion of the top of each of the solder balls are coplanar.

The planarizing of the solder balls before electrical characterization testing (i.e., "precoining") in accordance with embodiments of the invention, provides a planar surface against which a flat grounding plate can be placed. It is thus assured that each of the solder balls will reliably make electrical contact with the grounding plate, even if the solder balls were initially of different heights. The use of a heated plate, in accordance with certain embodiments of the invention, allows a relatively gentle pressure to be applied against the solder balls to flatten the highest solder balls. This is advantageous over hard pressing of the solder balls, since it is possible to damage the solder balls through such a technique.

The foregoing and other features, aspects and advantages of the present invention will become more apparent from the following detailed description of the present invention when taken in conjunction with the accompanying drawings.

BRIEF DESCRIPTION OF THE DRAWINGS

FIG. 3 is a top view of a test fixture constructed in accordance with embodiments of the present invention.

FIG. 4 is a side view of the test fixture of FIG. 3.

FIG. 5 is a top view of the test fixture of FIG. 3 with a chip scale package under test inserted within the test fixture according to the method of the present invention.

FIG. 6 is a cross-section of the test fixture of FIG. 5 with the inserted chip scale package under test, taken along line VI—VI.

FIG. 9 is a side view of the chip scale package of FIG. 8, after the heated plate compresses the highest solder balls of the package.

FIG. 10 is a side view of the chip scale package of FIG. 9, following the precoining process of the present invention.

DETAILED DESCRIPTION OF THE INVENTION

The present invention addresses and solves problems related to the uneven heights of solder balls that have been attached to a chip scale package for surface mount technology (SMT) board mounting prior to electrical characterization. Due to the uneven heights of the balls, electrical characterization is made more difficult as simultaneous grounding of the balls with uneven heights is problematic. Embodiments of the present invention perform a precoining operation in which a smooth heated plate with a flat bottom surface is put into contact with the solder balls and pressed. The heated plate is pressed until the tallest and shortest balls have the same height. Once all of the balls in the ball grid array (BGA) have the same height, a single flat conductive plate may reliably contact and ground all of the solder balls to be grounded.

Prior to discussing the precoining of the present invention, an exemplary test fixture that may be used for electrical characterization of the chip scale package will be described. However, the present invention may be used with other test fixtures and testing procedures, and finds particular utility where solder balls of even height are advantageous to a testing procedure.

Figure 1:
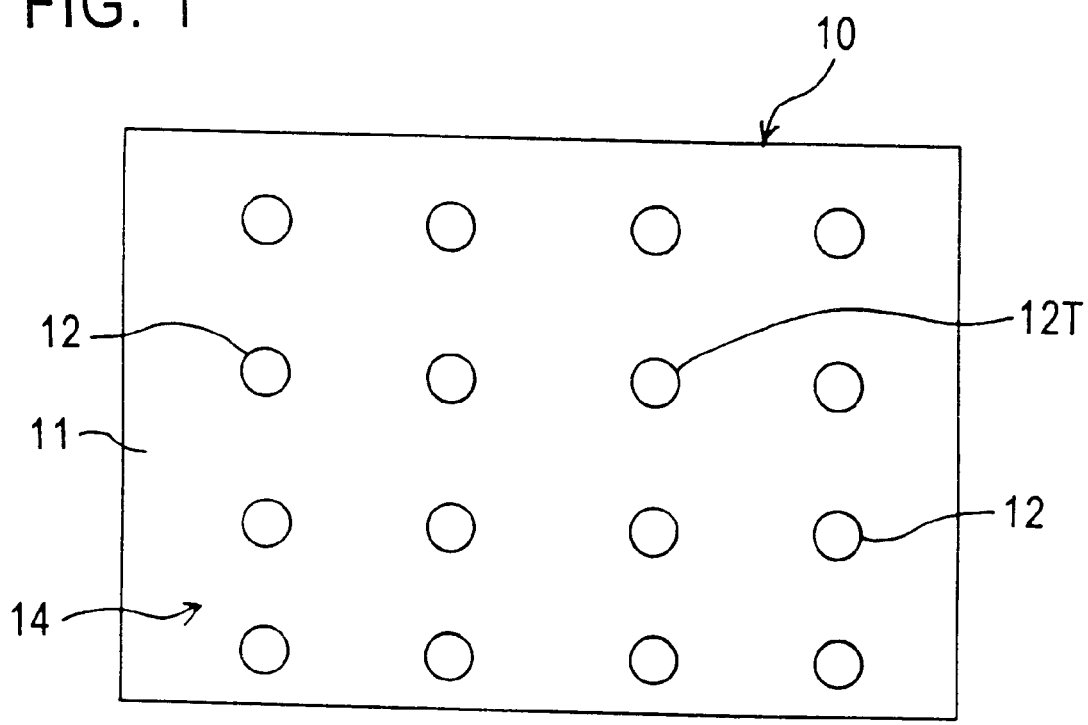
FIG. 1 is an enlarged, schematic top view of an exemplary chip scale package.

An exemplary embodiment of the chip scale package 10 is depicted in top view in FIG. 1. The chip scale package 10 includes a substrate 11, containing the integrated circuitry and/or interconnections. The circuitry is connected to a plurality of electrical contacts 12 formed on one side of the chip scale package 10. In preferred embodiments of the invention, the electrical contacts are formed by substrate balls 12 and are arranged in array 14. Thus, the solder balls form a ball grid array 14. Although depicted for illustration purposes in FIG. 1 as being relatively spread apart, in practice, the substrate balls 12 are very tightly packed on a chip scale package 10 in the ball grid array 14. Thus, it is difficult to isolate one of the solder balls 12 for electrical characteristic testing.

Figure 2:
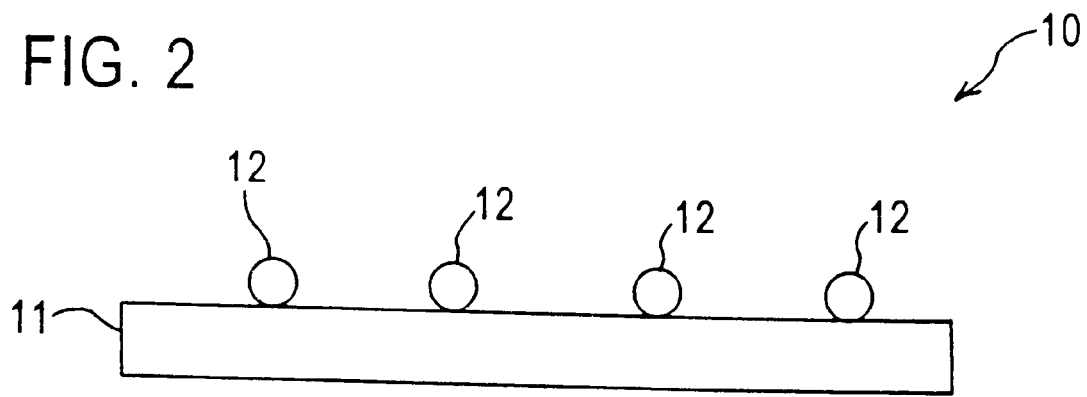
FIG. 2 Is a side view of the chip scale package of FIG. 1.

A side view of the chip scale package 10 is provided in FIG. 2. As can be seen from this figure, the electrical contacts or balls extend from only one side of the chip scale package 10. One or more of these solder balls 12 will be a solder ball at which testing is desired. This solder ball to be tested is designated in FIGS. 1 and 2 as 12T. With the remaining balls it is often desirable to ground the remaining balls 12 on the chip scale package 10, at the same time isolating the ball 12T under test.

FIG. 3 is a top view of a test fixture that can be used in conjunction with embodiments of the present invention. This test fixture is elegant in construction and relatively inexpensive to create. At the same time, however, it provides a thorough grounding of all of the electrical contacts of the chip scale package 10, allowing an isolated subset of the electrical contacts to be tested for electrical characterization. The test fixture 20 is exemplary only, however, as other configurations of a test fixture may be used to perform electrical characterization following the precoining of the package.

The test fixture 20 of FIG. 3 includes a base 22 made of either conductive or non-conductive material. For example, the base 22 may be made of a metal or may be made of a ceramic or carbon-fiber composite, or any other suitable material. The base 22 is generally planar in shape with a smooth surface so as not to damage a chip scale package placed on the surface of the base 22.

A conductive isolation plate 24, which serves as a grounding plate, is placed over the base 22. Generally, the isolation plate 24 is smaller in area than the base 22 and is substantially planar. The isolation plate 24 is a conductive plate, and is therefore made of a highly conductive material, such as a conductive metal. The isolation plate 24 is coupled to ground.

The isolation plate 24 is held against the base 22 by a pair of clamps 26 in the illustrated example of FIG. 3. Other holding devices. such as elastomeric hold-down devices, replace the clamps 26 in other embodiments of the test fixture. The clamping pressure applied against the isolation plate 24 is adjusted by an adjustment device 29, such as a screw. The adjustment device 29, e.g., a screw, is attached to the base 22.

The isolation plate 24 has a test hole 28 provided at a desired location on the surface of the isolation plate 24. Test hole 28 extends through the isolation plate 24 and is dimensioned so that it is slightly larger than the electrical contact or solder ball 12 of a chip scale package 10. The embodiment of FIG. 3 depicts a single test hole 28, but a plurality of test holes may be provided in isolation plate 24. This would provide access to a plurality of selected balls 12T for testing the electrical characteristics of the chip scale package 10 at these balls 12T. In the embodiment of FIG. 3, however, only a single test hole 28 is depicted.

FIG. 4 is a side view of the test fixture 20 of FIG. 3. The chip scale package 10 is inserted between the isolation plate 24 and the base 22. The clamps 26 may be removed and the isolation plate 24 completely removed from the test fixture 20 prior to the positioning of the chip scale package 10 to be tested. The isolation plate 24 is then placed carefully onto the chip scale package 10 and the clamps 26 tightened through the adjustment device 29.

FIG. 5 depicts the test fixture 20 of FIG. 3, but with a chip scale package 10 inserted in the test fixture 20. The chip scale package 10 is properly positioned on the base 22 and the isolation plate 24 is properly positioned on a chip scale package 10 such that the desired solder balls 12T to be tested fall completely within the test hole 28. If more than one solder ball is to be tested, additional test holes 28 are provided in the isolation plate 24. The clamping pressure applied by the adjustment devices 29, as depicted in FIG. 6, is enough to ensure proper contact of the isolation plate 24 against each of the solder balls 12, but not enough to damage the solder balls 12. With proper contact of the solder balls 12 that are not under test to the isolation plate 24, and the grounding of this isolation plate 24, the solder balls 12 that are not under test are all properly grounded.

The subset of electrical contacts or solder balls 12T that are under test are exposed through the test hole or holes 28 in the isolation plate 24. The dimensioning of the test hole 28 in the isolation plate 24 is slightly larger than the solder ball under test 12. This ensures that the solder ball under test 12T does not contact the conductive isolation plate 24. The test hole 28 needs to be large enough, however, to allow a test probe (not shown) to access the solder ball under test 12T without contacting the isolation plate 24. When the test probe is able to establish contact with the ball under test 12T, the electrical characteristics, such as inductance capacitance, and resistance at the ball under test 12T, which has been effectively isolated from the other balls 12 on the chip scale package 10, may be ascertained.

Figure 7:
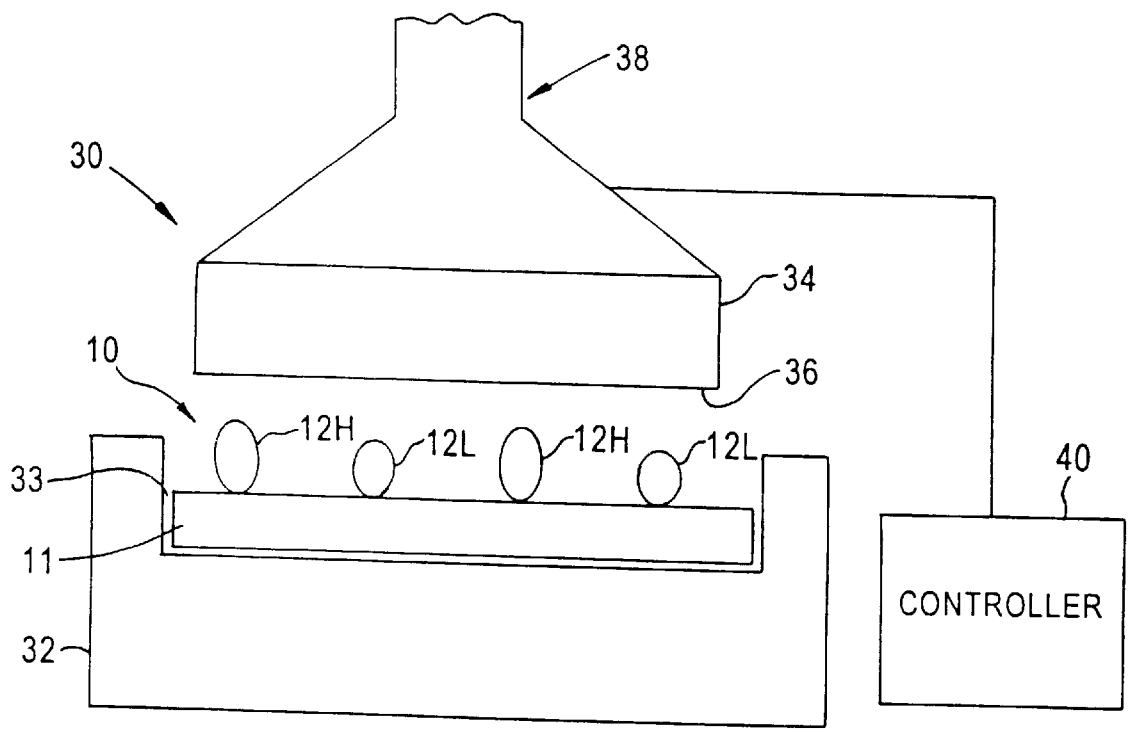
FIG. 7 is a side view of a chip scale package held in a fixture prior to a precoining procedure in accordance with embodiments of the present invention.

FIG. 7 is a side view of a precoining apparatus constructed in accordance with embodiments of the present invention, which can be used to prepare a chip scale package for electrical characterization in a test fixture, for example. The precoining apparatus 30 has a holding fixture 32 in which a chip scale package 10 is securely held. The package 10 includes the device attached to the substrate 11. The holding fixture 32 includes a recess 33 that is configured for securely holding the substrate 11 of the chip scale package 10. A non-adjustable holding fixture 32 may be used, as depicted in FIG. 7. In other embodiments, the recess 33 of the holding fixture 32 may be adjusted to accommodate chip scale packages of different sizes.

The chip scale package 10 depicted in FIG. 7 has a plurality of solder balls 12. as in the described Figures. However, as shown in FIG. 7, these solder balls 12 have different heights. This is a more accurate representation of actual manufactured chip scale packages and attached solder balls than the earlier Figures, since conventional manufacturing processes normally produce solder balls of slightly varying heights. The highest balls are referenced in the Figures with 12H, while the lower balls are referenced with 12L, for ease of description. The difference in heights may prevent a grounding plate, such as that shown in the exemplary test fixture of FIG. 3, from reliably contacting each of the solder balls to ground the solder balls during electrical characterization testing. The present invention overcomes this by planarizing the solder balls prior to electrical characterization of the chip scale package.

The precoining apparatus of the present invention further includes a pressing plate 34. The pressing plate 34 may be heated by resistance heating, for example, although other types of heating may be used to heat the plate 34. The pressing plate 34 has a flat, smooth bottom surface 36. A vertical positioning mechanism 38, under the control of a controller 40, moves the pressing plate 34 in a vertical direction towards and away from the holding fixture 32. The controller 40 also controls the temperature of the pressing plate 34, and the pressure applied by the pressing plate 34 to the solder balls 12H. A conventional controller may be used and readily programmed to control the positioning and heating of the pressing plate 34.

Figure 8:
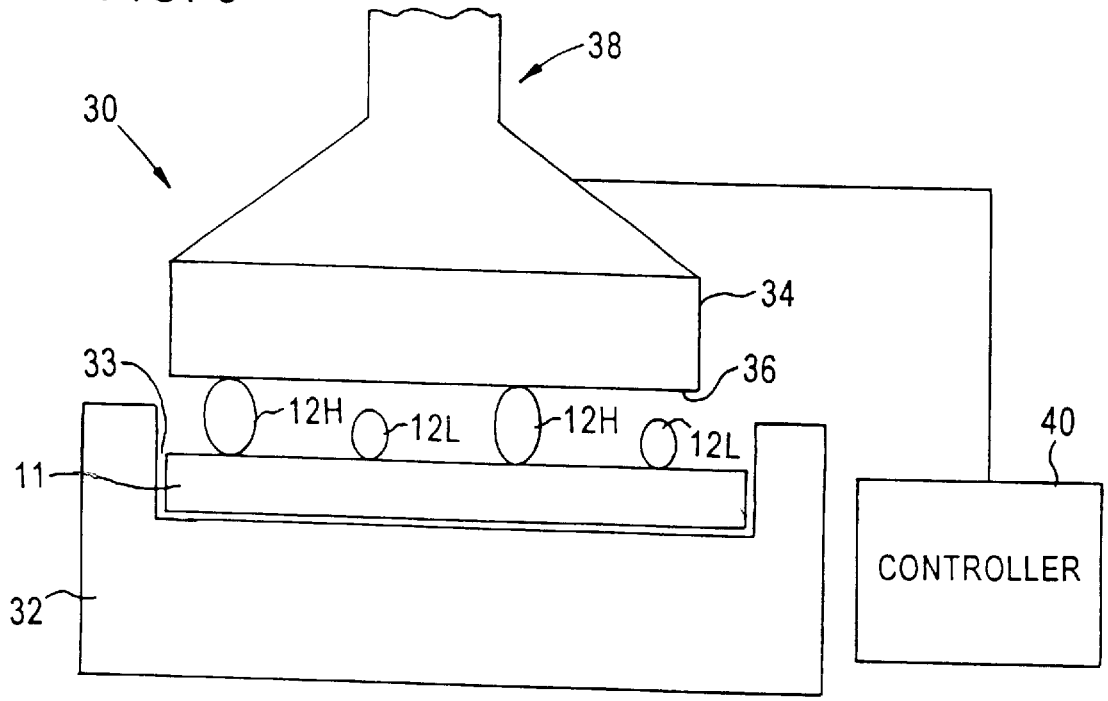
FIG. 8 is a side view of the chip scale package after a heated plate contacts the highest solder balls of the package.

After placement and securement of the package 10 within the holding fixture 34, with the solder balls 12H and 12L exposed, the pressing plate is positioned on the solder balls 12. The pressing plate 34 contacts the highest solder balls 12H first, as depicted in FIG. 8. At this time, the pressing plate 34 may be heated. Alternatively, the pressing plate 34 may be pre-heated. In still other embodiments, the pressing plate 34 is not heated throughout the process, and a purely mechanical pressing of the solder balls 12H is performed.

The controller 40 continues to control the heating of the pressing plate 34 and the vertical movement of the pressing plate 34 in a downward direction via the vertical positioning mechanism 38. A controlled pressure is thus applied against the highest solder balls 12H. The heat applied through the pressing plate 34 to the solder balls 12H causes them to flatten, but avoids the danger of breaking the solder balls, which is possible in embodiments that do not use heat in addition to pressure to deform the highest balls. The temperatures of the heated plate should be high enough to cause a slight flow of the solder in the solder balls 12H, but not enough to overly deform the balls 12H.

FIG. 9 depicts the precoining apparatus 30 after the pressing plate 34 has pressed the highest solder balls 12H to have the same height as the lowest solder balls 12L. It should be understood that the package 10 may have a number of different height solder balls, and not just two solder ball heights, as depicted in FIGS. 7 and 8 for explanatory purposes. The tops of the highest solder balls 12H (i.e., those solder balls that extend furthest from the package surface) are now coplanar with the tops of the lowest solder balls 12L (i.e., those solder balls that extend the least extent from the package surface).

Once the pressing plate 34 has completed pressing against the tops of the solder balls 12H with a controlled pressure until a portion of the top of each of the solder balls 12H, 12L are coplanar, the pressing and the heating are stopped. The pressing plate 34 is moved in an upward direction to its initial position, as shown in FIG. 10. The highest solder balls 12H have been slightly flattened, and exhibit flattened portions 42. A portion of the top of each of the solder balls 12H, 12L is coplanar with the portion of the top of each of the other solder balls 12H, 12L in the array.

Once the precoining process is completed, the package 10 may be removed from the holding fixture 32 and placed into a test fixture, such as the exemplary test fixture of FIG. 3. Due to the planarization of the tops of the solder balls 12H, 12L, a grounding plate placed on the solder balls 12H, 12L will reliably contact each of the desired solder balls 12H, 12L, except for those solder balls 12T that are to be tested.

The precoining of the solder balls of a ball grid array (BGA) type package prior to electrical characterization in accordance with the present invention, simplifies the electrical characterization process by assuring that a grounding plate will contact and ground all of the solder balls of the package that are to grounded. This is achieved in an efficient and rapid manner, thereby keeping manufacturing costs down and throughput high.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A precoining apparatus comprising:
   a holding fixture having a recess configured to hold a chip scale package that has a plurality of attached solder balls, such that the solder balls are exposed; and
   a heatable pressing plate movable to press against the solder balls to planarize the solder balls so that the tops of each of the solder balls lies in a common plane further comprising a vertical positioning mechanism couple to the pressing plate and which controllably moves the pressing plate against the solder balls.

2. The apparatus of claim 1, further comprising a controller coupled to the vertical positioning mechanism and to the pressing plate, the controller being configured to control the vertical positioning mechanism and heating of the pressing plate.

3. The apparatus of claim 2, wherein the pressing plate has a smooth, flat bottom surface which is positioned to contact the tops of the solder balls when the pressing plate is moved towards the solder balls by the vertical positioning mechanism.

* * * * *